United States Patent [19]
Zou et al.

[11] Patent Number: 5,365,173
[45] Date of Patent: Nov. 15, 1994

[54] TECHNIQUE FOR DRIVING QUADRATURE DUAL FREQUENCY RF RESONATORS FOR MAGNETIC RESONANCE SPECTROSCOPY/IMAGING BY FOUR-INDUCTIVE LOOP OVER COUPLING

[75] Inventors: Xueming Zou, Willoughby; David A. Lampman, Lakewood; Paul T. Orlando, Mentor, all of Ohio

[73] Assignee: Picker International, Inc., Highland Hts., Ohio

[21] Appl. No.: 19,234

[22] Filed: Feb. 18, 1993

Related U.S. Application Data

[63] Continuation-in-part of Ser. No. 919,215, Jul. 24, 1992, Pat. No. 5,280,248, and a continuation-in-part of Ser. No. 922,162, Jul. 29, 1992.

[51] Int. Cl.[5] .............................................. G01V 3/00
[52] U.S. Cl. ..................................... 324/318; 324/322
[58] Field of Search ............... 324/318, 322, 314, 307, 324/309; 128/653.5

[56] References Cited

U.S. PATENT DOCUMENTS

| | | | |
|---|---|---|---|
| 4,638,253 | 1/1987 | Jaskolski et al. | 324/318 |
| 4,939,465 | 7/1990 | Biehl et al. | 324/318 |
| 5,003,265 | 3/1991 | Leussler | 324/318 |
| 5,216,368 | 6/1993 | Leussler | 324/322 |

*Primary Examiner*—Louis Arana
*Attorney, Agent, or Firm*—Fay, Sharpe, Beall, Fagan, Minnich & McKee

[57] ABSTRACT

In a magnetic resonance system, four primary loop circuits (50, 52, 54, 56) are inductively coupled to a resonator coil (32) at 90° intervals around its circumference. The loop circuits are over-coupled to the resonator coil, i.e. they present more than the characteristic resistance of the associated cabling system which causes the maximum current transfer between the loop circuits and the resonator coil to be offset ($f_N$) in equal amounts in each direction from a natural resonance frequency ($f_0$) of the resonator coil. In one embodiment, two adjacent primary loop circuits provide for quadrature radio frequency transmission to and from the resonator coil at a first frequency and the other two primary loop circuits provide for quadrature radio frequency transmission to and from the resonator coil at a second resonance frequency. Each of the primary loop circuits includes a tank circuit (62) for blocking the passage of the frequency of the other quadrature primary loop circuit pair. In another embodiment, the third and fourth primary loop circuits are connected with tuning capacitors for adjusting the resonance frequency of the resonator coil relative to radio frequency signals applied and received by the primary loop circuit 180° opposite. This enables the frequency of each quadrature component of a quadrature RF signal to be adjusted separately. Analogously, this enables the resonance frequency of two linear RF signals to be adjusted independently.

20 Claims, 5 Drawing Sheets

TECHNIQUE FOR DRIVING QUADRATURE DUAL FREQUENCY RF RESONATORS FOR MAGNETIC RESONANCE SPECTROSCOPY/IMAGING BY FOUR-INDUCTIVE LOOP OVER COUPLING

The present application is a continuation-in-part of U.S. application Ser. No. 07/919,215 filed Jul. 24, 1992, now U.S. Pat. No. 5,280,248, and U.S. application Ser. No. 07/922,162 filed Jul. 29, 1992.

BACKGROUND OF THE INVENTION

The present invention relates to the transmission and receipt of radio frequency (RF) energy in magnetic resonance spectroscopy and imaging systems. The present invention finds particular application in conjunction with dual frequency, quadrature radio frequency resonator coils for magnetic resonance imagers and will be described with particular reference thereto. It is to be appreciated, however, that the present invention will also find application in conjunction with tuning and impedance matching techniques for quadrature and non-quadrature as well as for single and multi-frequency RF coils.

Inductive coupling has previously been used in RF or resonator coils for magnetic resonance imaging systems as well as in other radio frequency and microwave applications. One use for inductive coupling has been to drive an RF resonator by coupling the resonator to the magnetic field flux generated by a separate conductive loop circuit. More specifically, in an excitation mode, the conductive loop circuit includes a primary of the inductive coupling which generates the magnetic field flux which is inductively coupled to a secondary circuit of the resonator which in turn, generates the RF excitation signal. In a receive mode, the radio frequency resonance signal detected by the resonator is inductively transferred to the "primary" loop circuit, which functions as the secondary in the receive mode. In this manner, only the primary circuit is connected directly to the transmitter and receiver. The resonator coil is floating. One advantage of inductive couplings is that the lack of physical interconnection with associated electrical devices renders it easy to retain quadrature symmetry. Another advantage is that spurious RF noises are reduced because a balanced feed to the RF resonator is automatically achieved with an inductive coupling.

In magnetic resonance imaging and spectroscopy, the input impedance when looking in to the driving port is matched to the characteristic impedance of the cables of the RF system, typically 50 Ohms. When the input and characteristic impedances are matched, the maximum possible current is provided in the secondary circuit, i.e. the resonator. Under this condition, the RF resonator efficiently excites and receives magnetic resonance signals from the nuclear spin system. The real or resistive component ($R_{IN}$) and the imaginary or reactance component ($X_{IN}$) of the input impedance (Z) can be expressed as follows:

$$R_{IN} = R_P + (2\pi f M)^2 R_S / (R_S^2 + X_S^2) \quad (1)$$

$$X_{IN} = X_P - (2\pi f M)^2 X_S / (R_S^2 + X_S^2) \quad (2),$$

where $R_P$ and $R_S$ are the resistance of the primary and secondary circuit, respectively, $X_P$ and $X_S$ are the reactance of the primary and secondary circuit, respectively, f is the frequency, and M represents the mutual inductance of the two inductively coupled circuits. In Equations (1) and (2), the second term on the right-hand side represents the coupled resistance and coupled reactance, respectively, from the secondary circuit. When the RF resonator is loaded, the resistance of the secondary includes both the resistance of the resonator circuit itself and the resistance from patient loading. To establish the maximum RF power transfer condition, the input resistance $R_{IN}$ should equal the characteristic resistance of the cable, e.g. 50 Ohms and the input reactance should be minimized or zeroed, at the coil resonance frequency $f_0$, i.e.:

$$R_P + (2\pi f_0 M)^2 R_S / (R_S^2 + X_S^2) = 50 \; \Omega \quad (3)$$

$$X_P = (2\pi f_0 M)^2 X_S / (R_S^2 + X_S^2) \quad (4).$$

In the past, the critical coupling expressed in Equation (4) has been selected to couple the resonator and the primary driving circuit. To obtain the condition for the maximum possible secondary current, both the primary and secondary reactances $X_P$ and $X_S$ have been tuned to zero. That is, both the primary and secondary circuit have been on-resonance. The primary resistance $R_P$ has been typically much smaller than the second term of Equation (3) and was ignored. The second term of Equation (3) has been tuned to 50 Ohms. More specifically, the mutual inductance M has been tuned such that the real part of Equation (3) has been matched to the characteristic resistance of the cable 50 Ohms at the resonance frequency $f_0$. Tuning the mutual inductance M has required changing the geometric shape of the primary circuit and the relative physical positioning of the primary and secondary circuits. These tuning changes have been made by mechanical adjustment. See for example, U.S. Pat. No. 4,638,253 of Jaskolski and Eash, and U.S. Pat. No. 4,939,465 of Biehl and Laukien.

Typically, the mechanical adjustments have involved rotational and dimensional changes in the primary coupling loop circuit. This required flexibility causes electrical instabilities in the RF cable due to the difficulties in maintaining the coupling circuits at the same position every time the coil matching and tuning are readjusted. Another disadvantage is that the primary/secondary coupling loop circuit has the same resonance frequency as the RF resonator. Fine tuning of the coupling circuit introduces an additional work load and tends to be very time consuming.

Yet another disadvantage is that the need to rotate the primary coupling circuit for tuning purposes causes the circuit to be disposed physically closer to the RF shield. The closer proximity to the RF shield introduces more RF currents in the shield near the primary coupling loop, disturbing the symmetry of the entire coil/shield system and introducing more circuit losses.

The present invention contemplates a new and improved inductive coupling technique which overcomes the above-referenced problems and others.

SUMMARY OF THE INVENTION

In accordance with one aspect of the present invention, a magnetic resonance system is provided. A static magnetic field means generates a static magnetic field through an examination region. A gradient field means creates magnetic field gradients across the examination region. A resonator coil transmits radio frequency signals into the examination region, receives radio frequency signals from the examination region, or both transmits radio frequency signals and receives radio frequency signals from the examination region. Four primary loop circuits are inductively coupled to the resonator coil at 90° intervals therearound. At least first and second primary loop circuits are connected by first and second cable means with a first radio frequency receiver and transmitter means.

In accordance with a more limited aspect of the present invention, the primary loop circuits are inductively over-coupled with the resonator coil. That is, the loop circuits present a higher resistance than the characteristic impedance of the cable means.

In accordance with another more limited aspect of the present invention, the first and second loop circuits transfer a first frequency signal in quadrature.

In accordance with a more limited aspect of the present invention, the third and fourth primary loop circuits are connected with adjustable reactances for tuning the quadrature components transferred through the first and second primary loop circuits, independently.

In accordance with another more limited aspect of the present invention, the third and fourth primary loop circuits are connected with a second radio frequency transmitter and receiver means. The first and second radio frequency transmitter and receiver means operate at different frequencies such that (1) the first and second primary loop circuits drive the resonator coil in quadrature at a first resonance frequency and (2) the third and fourth primary loop circuits drive the resonator coil in quadrature at a second resonance frequency.

In accordance with another more limited aspect of the present invention, the first and second loop circuits are connected with radio frequency transmitter means for transferring radio frequency signals of first and second frequencies, respectively, into and out of the resonator coil and the third and fourth primary loop circuits are connected with adjustable reactances.

In accordance with another aspect of the present invention, a magnetic resonance system is provided. A means is provided for generating a magnetic field through an examination region. A radio frequency resonator coil is disposed around the examination region. A transmitter means provides radio frequency signals for transmission by the radio frequency resonator coil into the examination region. A receiver means demodulates radio frequency resonance signals received by the resonator coil. A cable means is connected with the transmitter means for conveying radio frequency signals from the transmitter means and is connected with the receiver means for conveying radio frequency signals to the receiver means. The cable means has a characteristic resistance. At least a first primary loop circuit inductively couples the cable means with the resonator circuit. The first primary loop circuit includes at least one reactance element for over-coupling the first primary loop circuit with the resonator coil such that the first primary loop circuit presents a resistance to the cable means which is greater than the characteristic resistance. In this manner, a maximum current transfer between the cable means and the resonator coil occurs at (1) a first maximum current transfer frequency higher than a natural resonance frequency of the resonator coil and (2) at a second maximum current transfer frequency lower than the natural resonance frequency.

In accordance with another aspect of the present invention, a method of magnetic resonance is provided. A magnetic field is generated through an examination region within a radio frequency resonator coil which has a natural resonance frequency. A first primary loop circuit is inductively over-coupled to the resonator coil such that a maximum radio frequency current transfer between the resonator coil and the primary loop circuit occurs at higher and lower frequencies offset to either side of the natural resonance frequency of the coil, the natural resonance frequency of the resonator coil and the inductive over-coupling are selected such that the higher and lower maximum current transfer frequencies substantially coincide with resonance frequencies of two dipoles in the examination region to undergo magnetic resonance examination.

In accordance with a more limited aspect of the present invention, additional primary loop circuits are provided at 90° intervals and radio frequency signals are transferred in quadrature between the resonator and primary loop circuits.

In accordance with another more limited aspect of the present invention, radio frequency signals are transferred between the first and a second primary loop circuit disposed 90° offset around the resonator coil. Adjustable reactances are inductively coupled to the resonator coil 180° offset from the first and second primary loop circuits for adjusting the higher and lower frequencies of maximum current transfer independently.

In accordance with another aspect of the present invention, a static magnetic field is generated through an examination region within a radio frequency resonator coil. Four primary loop circuits are inductively coupled to the resonator coil at 90° intervals therearound. In one mode, two of the 90° displaced loop circuits receive radio frequency signals of a first frequency in quadrature and the other two primary loop circuits receive radio frequency signals of a second frequency in quadrature. In a second mode, two of the first primary loop circuits inductively transfer radio frequency signals of a first frequency in quadrature and the other two primary loop circuits are connected with adjustable reactances. The reactances are adjusted for selectively adjusting each quadrature component. In a third mode, two of the primary loop circuits transfer linear radio frequency signals of first and second frequencies between the loop circuits and the resonator coil. The other two loop circuits are connected with adjustable reactances which are adjusted to tune the first and second frequencies.

One advantage of the present technique is that a dual frequency resonator is provided with a quadrature coupling at both frequencies.

Another advantage of the present invention is that resonator impedance matching is adjusted by tuning capacitors or other reactances in the primary circuit without mechanical adjustments.

Another advantage of the present invention is that excellent isolation between two different resonance frequencies and between quadrature modes of the same frequency are obtained.

Another advantage of the present invention is that it facilitates tuning by enabling each quadrature component to be adjusted independently.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION OF THE PREFERRED EMBODIMENTS

Figure 1:
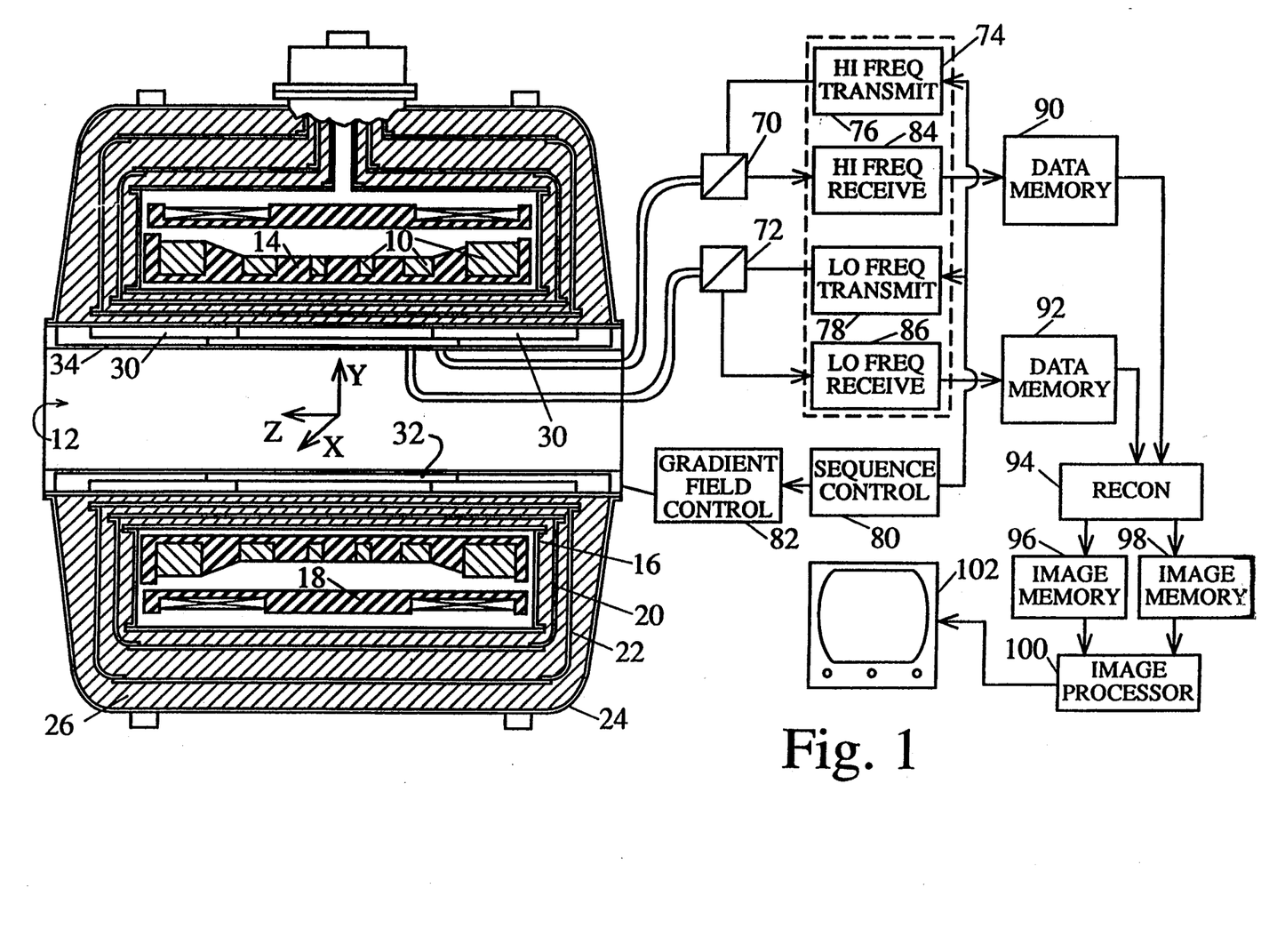
FIG. 1 is a diagrammatic illustration of a magnetic resonance imaging apparatus in accordance with the present invention.

With reference to FIG. 1, a plurality of superconducting main magnetic field coils 10 generate a generally uniform static magnetic field along a longitudinal or z-axis of a central bore 12. The superconducting coils are mounted on a dielectric former 14 and received in an annular, helium vessel 16. The helium vessel is filled with liquid helium to maintain the superconducting magnets at their superconducting temperature. A main magnetic field shield coil assembly 18 generates a magnetic field which opposes the fields generated by the main magnets 10 in regions surrounding the superconducting magnets 10.

The annular helium reservoir 16 is surrounded by a first cold shield 20 which is maintained at about 20° K. or less. A second cold shield assembly 22 is chilled to about 60°–70° K. or less. An outer vacuum vessel 24 encases the cold shields to define a vacuum reservoir therearound. Layers of mylar insulation 26 are arranged between the vacuum vessel, the cold shields, and the helium reservoir.

A circularly cylindrical, whole body gradient coil assembly 30 is mounted on a circularly cylindrical dielectric former and mounted within the bore 12. A circularly cylindrical, whole body RF coil 32 is mounted on a circularly cylindrical dielectric former and mounted within the bore 12. A circularly cylindrical dielectric cosmetic sleeve 34 shields the RF and gradient coils from view and protects them from damage.

Figure 2:
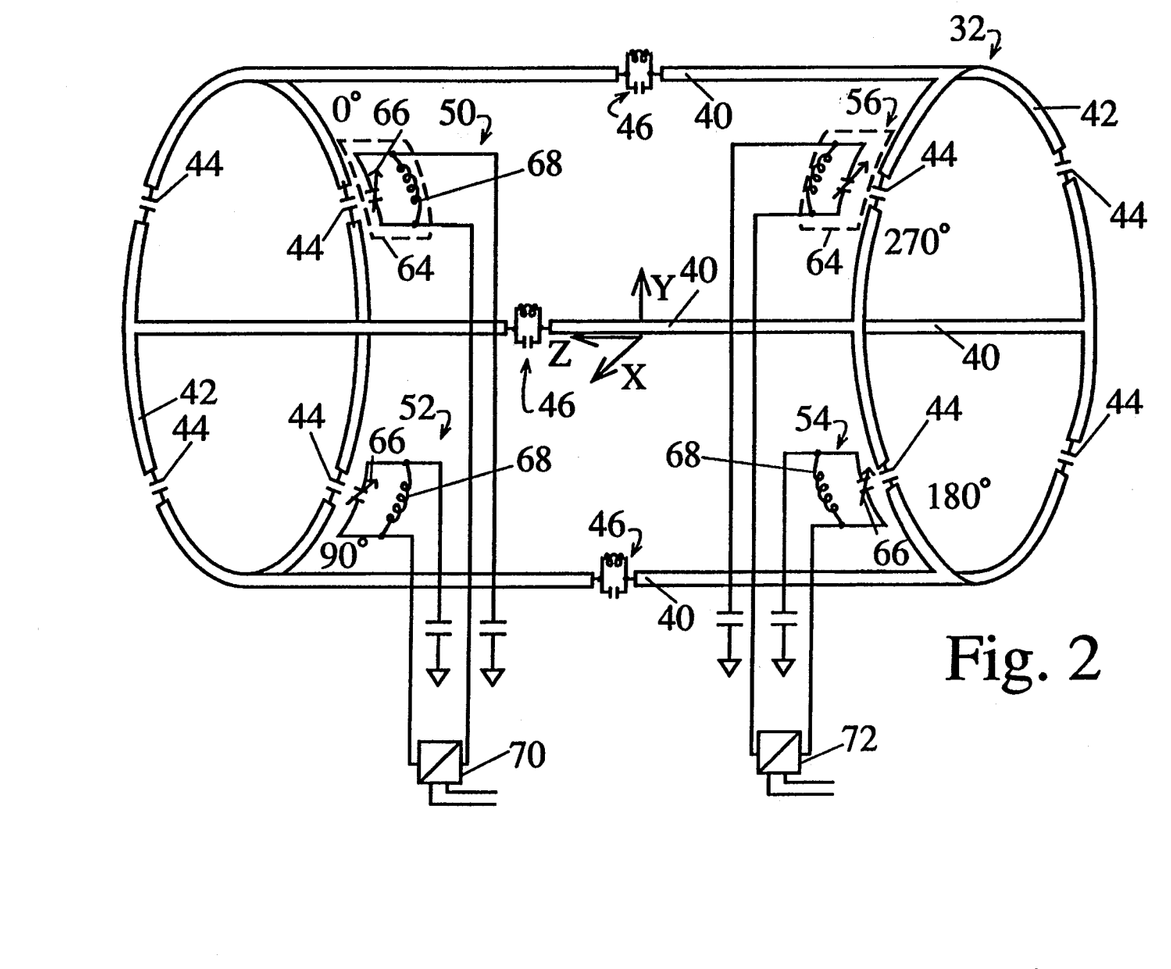
FIG. 2 is a perspective view of the RF resonator coil of FIG. 1 and four inductive couplings for operation in a dual frequency quadrature mode.

With continuing reference to FIG. 1 and further reference to FIG. 2, the RF coil 32 in the preferred embodiment is a "birdcage" type RF coil. The RF coil includes a plurality of longitudinally extending electrical conductors 40. Although four longitudinal conductors are illustrated in FIG. 2, for simplicity of illustration it is to be appreciated that larger numbers of longitudinal conductors can be advantageously provided without departing from the present invention. The longitudinal conductors are electrically connected at their ends by a pair of electrically conductive end rings 42. Each end ring includes capacitive couplings 44 between each of the longitudinal conductors. Each of the longitudinal conductors is connected in series with a tank circuit 46. The tank circuits 46 are tuned relative to capacitors 44 and other reactance characteristics such that the RF resonator coil 32 has two natural resonant frequencies, i.e. is a double-tuned coil. The tank circuits are tuned such that a first resonance frequency of the coil is at the resonance frequency of a first dipole to be imaged, e.g. hydrogen, and a second resonance frequency is at the resonance frequency of another dipole of interest, e.g. carbon or phosphorous.

Four primary circuits 50, 52, 54, and 56 are disposed in an inductively coupled relationship with the double-tuned resonator coil 32 at 90° intervals around the central or z-axis. The primary or driving circuits 50, 52 54, 56 are mounted in a fixed relationship relative to the resonator coil 32 such that the mutual inductance M is fixed between each primary loop circuit and the coil. Further, each of the primary loop circuits is positioned sufficiently close to one of the end loops 42 of the resonator coil that the transferred resistance, i.e. the second term on the right-hand side of Equation (1) is greater than the characteristic resistance, typically 50 Ohms, at the natural resonance frequency $f_0$ of the resonator coil 32.

Figure 3:
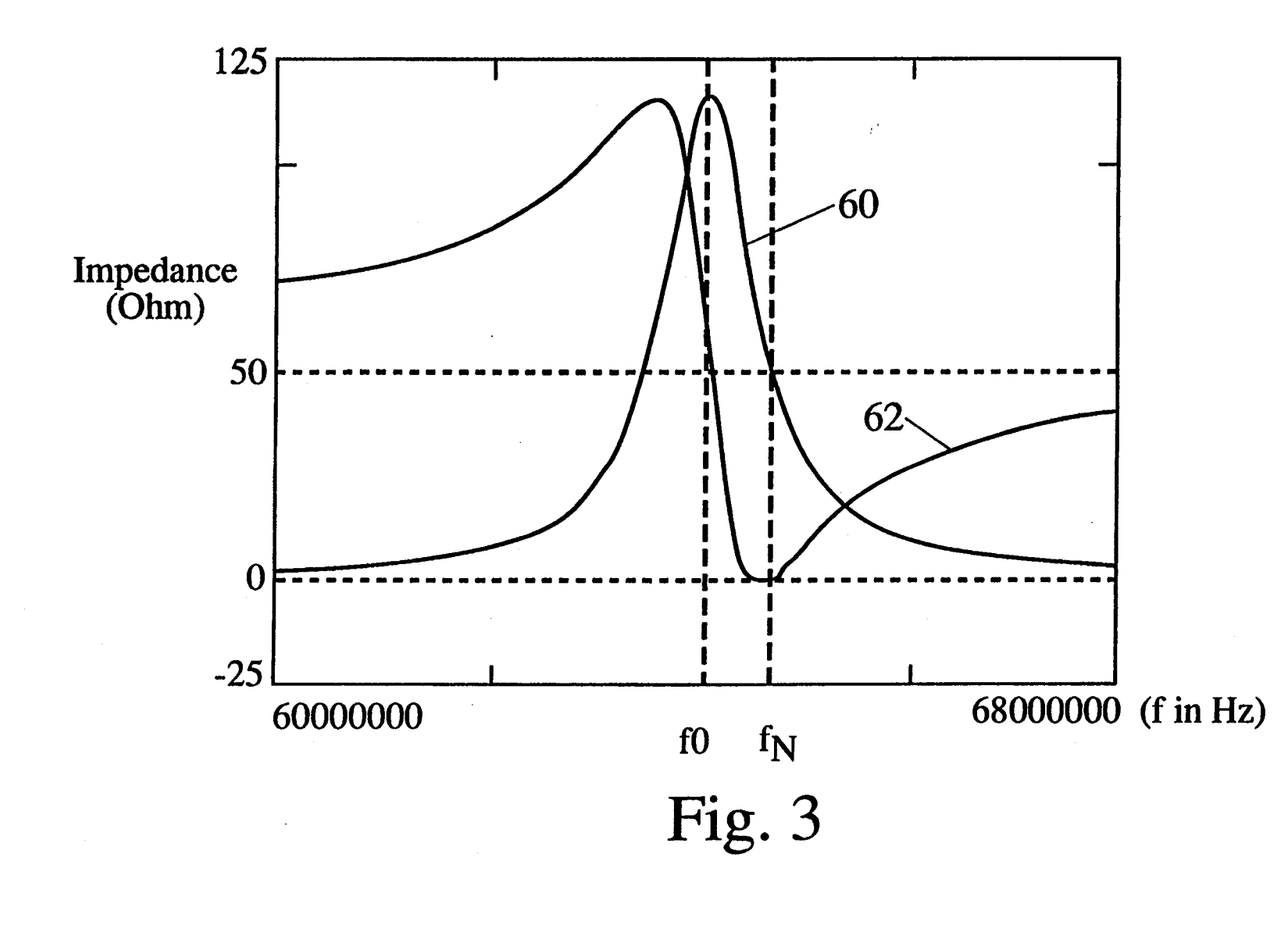
FIG. 3 is a diagrammatic illustration of input impedance as a function of frequency with over-coupling.

With reference to FIG. 3, a transferred resistance which matches the characteristic impedance is illustrated by curve 60. By distinction, having a transferred resistance greater than the characteristic resistance is denoted as "over-coupling". At one of the natural resonance frequency $f_0$ tuned by reactances 44, 46, RF power cannot be delivered efficiently to the resonator coil due to the over-coupling impedance mismatch. However, near each natural resonance frequency $f_0$ of the double-tuned resonator coil, Equations (3) and (4) are satisfied at a frequency $f_N$ in the neighborhood of $f_0$. At the frequency $f_N$, the real part of the input impedance is 50 Ohms and the imaginary part $X_{IN}$ is tuned to zero. There are two frequencies, one on each side of $f_0$ in the peak of the input impedance curve 62, where the input impedance is matched to 50 Ohms. At $f_N$, the maximum current condition is achieved in the resonator to support the nuclear magnetic resonance functions. When Equations (3) and (4) are satisfied in this way, the primary loop circuits are off-resonance from the natural resonance frequency of the double-tuned resonator. FIG. 3 illustrates the solution of impedance matching on the higher frequency side. To tune the input reactance $X_N$, the reactance of the corresponding one of primary loops 50, 52, 54, and 56 is adjusted. With reference again to FIG. 2, each of the primary loop circuits includes a tank circuit 64 which includes an adjustable capacitance 66 and an impedance 68. When the input impedance is matched to real 50 Ohms, the self-resonance frequency of the primary coupling circuit is far above $f_0$.

In the embodiment of FIG. 2, primary loop circuits 50 and 52 are used to drive the double-tuned resonator coil 32 at the higher resonance frequency, preferably the resonance frequency of hydrogen or protons. The primary coupling circuits are placed at a 90° angle to each other such that the coupling between them is minimized. This enables the primary loop circuits 50 and 52 to operate at the hydrogen frequency in quadrature. Analogously, the third and fourth primary loop circuits 54 and 56 are used to drive the resonator coil at the lower resonance frequency, e.g. the resonance frequency of carbon or phosphorous. The lower frequency primary loop circuits 54 and 56 are again inductively coupled to one of the end rings 42 offset 90° from each other to minimize coupling. In FIG. 2, the high and low frequency primary coupling circuits are illustrated as being inductively coupled with opposite end rings 42 for simplicity of illustration. It is to be appreciated that all four primary loop circuits can advantageously be coupled to the same end ring.

To eliminate cross-coupling between the high and low frequencies, the low frequency primary circuits are 90° rotated relative to the high frequency primary circuits. Although the 90° rotated couplings have minimal coupling, the primary loop circuits 180° apart would couple. To prevent coupling between the 180° opposite loop circuits, the tank circuits 64 are tuned to act as a band reject filter for the other frequency. That is, in the low frequency coupling loop circuits, the third and fourth tank circuits are tuned to resonate at the higher frequency such that the third and fourth tank circuits present a high impedance to signals at the higher resonance frequency. In this manner, the low frequency coupling circuits will not support the high frequency, effectively blocking its transmission. Similarly, the first and second primary loop circuits 50, 52 have their tank circuits 64 tuned to be on-resonance at the lower frequency. This presents a high impedance at the lower frequency which will not support the low frequency RF current flow in the high frequency coupling circuits.

With continuing reference to FIG. 2 and reference again to FIG. 1, when the dual frequency resonator is operated at the higher frequency, the first and second primary loop circuits 50, 52 are connected to a combiner/divider circuit 70 for higher frequency operation. During transmission, the combiner/divider divides the transmit RF power into two halves, with half going to each of the first and second primary loop circuits 50 and 52. During reception, the combiner/divider circuit combines the NMR signals received by the first and second primary loop circuits 50 and 52. In both the transmission and reception modes, the combiner/divider circuit provides a 90° phase shift between the two RF sources. In this manner, the quadrature resonator saves RF power by a factor of 2 in the transmission mode and increases the signal-to-noise ratio by a factor of 1.414 in the reception mode. An analogous combiner/divider 72 is provided for the third and fourth primary loop circuits 54, 56.

A transmitter and receiver means 74 includes a high frequency transmitter means 76 which provides RF signals at the first higher resonance frequency, preferably the resonance frequency of hydrogen or protons at the magnetic field strength of the main magnets. Analogously, a low frequency transmitter means 78 provides radio frequency signals to the coupler/divider 72 at the second, lower resonance frequency, such as the resonance frequency of carbon, phosphorous, or other dipole of interest. A sequence control means 80 controls the transmitters 76 and 78 as well as a gradient field control means 82 for applying gradient field and RF pulses in various conventional imaging and spectroscopy sequences as is known in the art.

After excitation, magnetic resonance signals are received by the resonator coil 32 and conveyed to the combiner/dividers 70, 72. A first higher resonance frequency receiver 84 receives the first higher resonance frequency signals from the combiner/divider 70. Analogously, a second, low frequency receiver 86 receives the lower frequency resonance signals from the combiner/divider 72. The received resonance signals are digitized into data lines and stored in high and low resonance frequency data memories 90 and 92. This enables corresponding data lines to be generated alternately in the high and low resonance frequencies, for example. An image reconstruction means 94, such as a two-dimensional inverse Fourier transform reconstruction means, reconstructs the high and low frequency resonance signals into high and low frequency image representations which are stored in corresponding image memories 96 and 98. Optionally, the reconstruction means may reconstruct a weighted combination of the data from the high and low frequency resonance data memories. An image processing means 100 converts the high frequency image representation, the low frequency image representation, both image representations, a combination of the image representations, or the like into the appropriate format for display on a video monitor 102 or other display means.

Figure 4:
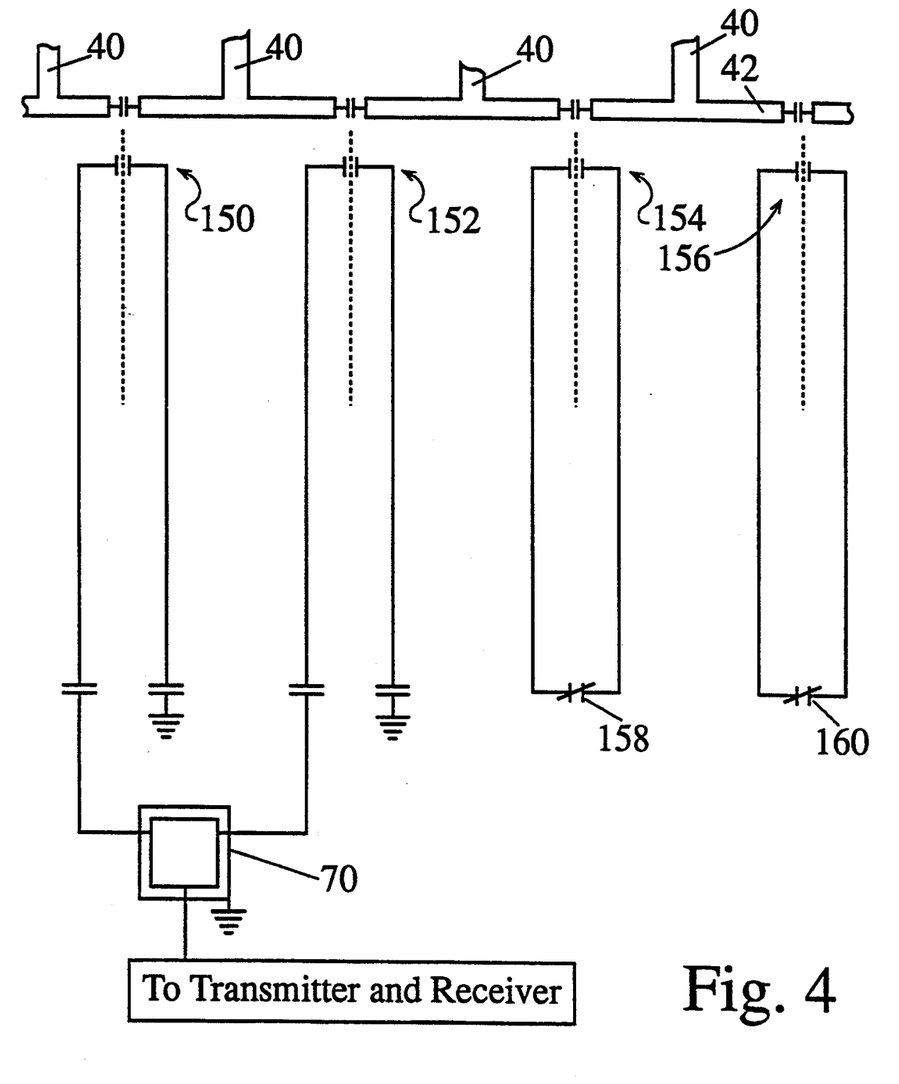
FIG. 4 is a diagrammatic illustration of coupling circuitry for a single frequency quadrature coil with two inductive tuning circuits for tuning each quadrature component independently.

With reference to FIG. 4, rather than driving a double-tuned resonator in quadrature at two frequencies, the present invention is also amenable to use at a single frequency with simplified tuning. Primary coupling loop circuits 150 and 152 are inductively coupled to an end ring 42 of the RF resonator coil 32 for providing RF signals to the coil from a combiner/divider 70 and for providing RF signals from the coil to the combiner/divider 70 in a reception mode. The primary loop circuits 150 and 152 are connected 90° apart to minimize coupling for quadrature operation. A pair of inductively coupled tuning loops include additional primary loop circuits 154, 156 which are inductively coupled to the end ring 42 180° offset from the first and second primary loop coupling circuits 150, 152. The primary loop coupling circuits 154, 156 are connected with adjustable tuning capacitors 158, 160, respectively. The coil resonance frequency is tuned by adjusting capacitors 158 or 160 to bring the tuning loop resonance frequency closer or further away from the coil resonance frequency. Due to the orthogonality of the two tuning loops, each inductive tuning loop tunes only one quadrature mode of the radio frequency resonance signals independent of the other quadrature mode. In the mode of FIG. 4, the transmitter and receiver means utilizes only a single transmitter and receiver.

Figure 5:
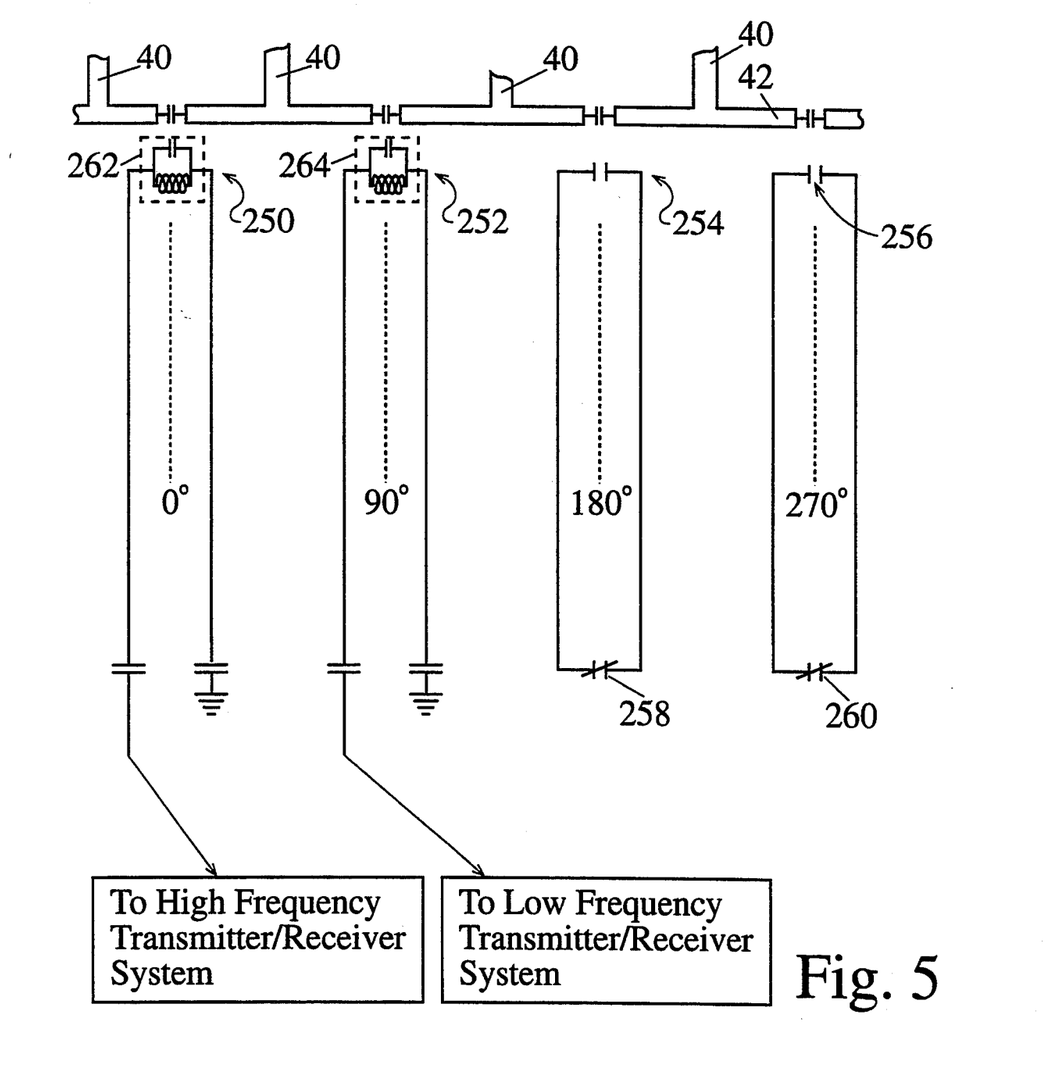
FIG. 5 is a diagrammatic illustration of coupling circuitry for a dual frequency linear resonator coil with inductive tuning circuits for tuning each frequency independently.

With reference to FIG. 5, the present invention is also amenable to independent tuning of the individual frequencies of a double-tuned resonator. A first primary loop circuit 250 is inductively coupled to the end ring 42 of the resonator coil 32. A second primary loop circuit 252 is inductively coupled to the end ring 90° displaced from the first primary loop circuit. The first primary loop circuit 250 includes a tank circuit 262 which is tuned to the second resonance frequency and the second primary loop circuit 252 includes a tank circuit 264 which is tuned to the first resonance frequency. The first primary loop circuit is connected to the higher frequency transmitter 76 and the higher frequency receiver 84. Analogously, the second primary loop circuit 252 is connected to the lower frequency transmitter 78 and the lower frequency receiver 86. The higher and lower frequency transmitters operate in a linear rather than a quadrature mode in this embodiment. Additional primary loop circuits 254 and 256 are inductively coupled to the end ring 42 180° opposite the first and second primary loop coils 250, 252. Tuning capacitors 258, 260 are selectively adjusted to adjust the first or higher resonance frequency and the second or lower resonance frequency.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance system comprising:
   a static magnetic field means for generating a static magnetic field through an examination region;
   a gradient field means for creating magnetic field gradients across the examination region;
   a resonator coil for at least one of (1) transmitting radio frequency signals into the examination region, and (2) receiving radio frequency resonance signals from the examination region;
   first, second, third, and fourth primary loop circuits inductively coupled to the resonator coil at 90° intervals therearound for transferring at least one of radio frequency excitation signals and radio frequency resonance signals between the resonator coil and the first, second, third, and fourth primary loop circuits, at least the first and second primary loop circuits being connected by a cable means with a radio frequency receiver and transmitter means.

2. A magnetic resonance system comprising:
   a static magnetic field means for generating a static magnetic field through an examination region;
   a gradient field means for creating magnetic field gradients across the examination region;
   a resonator coil for transmitting radio frequency signals into the examination region, and receiving radio frequency resonance signals from the examination region;
   first, second, third, and fourth primary loop circuits inductively coupled to the resonator coil at 90° intervals therearound;
   a radio frequency transmitter means for generating radio frequency resonance excitation signals;
   a first combiner/divider means connected with the first and second primary loop circuits and with the radio frequency transmitter means; in a transmit mode, the first combiner/divider means divides and imposes a 90° phase shift in the radio frequency signals and transfers the radio frequency signals to the first and second primary loop circuits and the resonator coil for exciting magnetic resonance; in a receive mode, magnetic resonance signals received by the resonator coil being inductively transferred through the first and second primary loop circuits to the first combiner/divider, the first combiner/divider means imposes a 90° phase shift on received magnetic resonance signals and combines them;
   a radio frequency receiver connected with the combiner/divider to receive the phase shifted resonance signals therefrom.

3. The magnetic resonance system as set forth in claim 2 wherein at least the first and second primary loop circuits are inductively over-coupled to the resonator coil such that each presents greater than a characteristic resistance of the cable means to the combiner/divider means.

4. The magnetic resonance system as set forth in claim 2 wherein:
   the resonator coil is double-tuned to resonate at a higher frequency and a lower frequency;
   the transmitter and receiver means includes a higher frequency transmitter, a lower frequency transmitter, a higher frequency receiver, and a lower frequency receiver, the first combiner/divider means being connected with the higher frequency transmitter and the higher frequency receiver;
   the third and fourth primary loop circuits are connected with a second combiner/divider means, the second combiner/divider means being connected with the lower frequency transmitter and the lower frequency receiver; in a transmit mode, the second combiner/divider divides and imposes a 90° phase shift in the RF signals conveyed to the third and fourth primary loop circuits; in a receive mode, the second combiner/divider means imposes a 90° phase shift on received magnetic resonance signals and combines them.

5. The magnetic resonance system as set forth in claim 4 wherein the first and second primary loop circuits include a bandpass filter means for blocking signals of the lower frequency and wherein the third and fourth primary loop circuits include a bandpass filter means for blocking signals of the higher frequency.

6. The magnetic resonance system as set forth in claim 4 wherein:
   the first and second primary loop circuit includes tank circuits which are resonant at the lower frequency; and
   wherein the third and fourth primary loop circuits include tank circuits which are resonant at the higher frequency.

7. The magnetic resonance system as set forth in claim 2 wherein:
   the third primary loop circuits is connected with an adjustable reactance for adjusting a resonance frequency of the resonator coil with respect to a quadrature component associated with the first primary loop circuit; and
   the fourth primary loop circuit is connected with an adjustable reactance for adjusting a resonance frequency of the resonator coil with respect to a quadrature component associated with the second primary loop circuit.

8. A magnetic resonance system comprising:
   a static magnetic field means for generating a static magnetic field through an examination region;
   a gradient field means for creating magnetic field gradients across the examination region;
   a resonator coil having a natural resonance frequency for at least one of (1) transmitting radio frequency signals into the examination region, and (2) receiving radio frequency resonance signals from the examination region;
   first, second, third, and fourth primary loop circuits inductively coupled to the resonator coil at 90° intervals therearound for inductively transferring radio frequency signals between the resonator coil and the primary loop circuits, at least the first and second primary loop circuits being inductively over-coupled to the resonator coil such that each presents a greater resistance than a characteristic resistance of the cable means, such that maximum current transfer between the primary loop circuits and the resonator coil occurs at higher and lower frequencies offset above and below the natural resonance frequency of the resonator coil.

9. The magnetic resonance system as set forth in claim 8 wherein:
the third primary loop circuit is connected with an adjustable reactance for adjusting the maximum current transfer frequency associated with the first primary loop circuit; and
the fourth primary loop circuit is connected with an adjustable reactance for adjusting the maximum current frequency associated with the second primary loop circuit.

10. The magnetic resonance system as set forth in claim 9 wherein the resonator coil is double-tuned to higher and lower frequencies, and the first primary loop circuit is connected with a high frequency receiver and a higher frequency transmitter for radio frequency signals of the higher frequency and the second primary loop circuit is connected with a lower frequency transmitter and a lower frequency receiver for radio frequency signals of the lower frequency, whereby the higher and lower frequencies are independently adjustable by the adjustable reactances associated with the third and fourth primary loop circuits.

11. A magnetic resonance system comprising:
a means for generating a magnetic field through an examination region;
a radio frequency resonator coil disposed around the examination region;
a transmitter means for providing radio frequency signals for transmission by the radio frequency resonator coil into the examination region;
a receiver means for demodulating radio frequency resonance signals received by the resonator coil;
a cable means connected with the transmitter means for conveying radio frequency signals from the transmitter means and connected with the receiver means for conveying radio frequency signals to the receiver means, the cable means having a characteristic resistance;
at least a first primary loop circuit for inductively coupling the cable means with the resonator coil, the first primary loop circuit including at least one reactance element for over-coupling the first primary loop circuit with the resonator coil such that the first primary loop circuit presents a resistance to the cable means which is greater than the characteristic resistance, whereby a maximum current transfer between the cable means and the resonator coil occurs at a first higher frequency than a first natural resonance frequency of the resonator coil and at a first lower frequency than the natural resonance frequency.

12. The magnetic resonance system as set forth in claim 11 further including:
a second primary loop circuit inductively coupled to the resonator circuit 90° displaced from the first primary loop circuit such that radio frequency signals transferred by the second primary loop circuit are in quadrature relative to and isolated from radio frequency signals transferred by the first primary loop circuit, the second primary loop circuit being connected with the cable means, the second primary loop circuit including at least one reactance element for over-coupling the second primary loop circuit with the resonator coil such that the second primary loop circuit presents a resistance to the cable means which is greater than the characteristic resistance, whereby a maximum current transfer between the cable means and the resonator coil through second primary loop circuit occurs at a second higher frequency than a second natural resonance frequency of the resonator coil and at second lower frequency than a second natural resonance frequency.

13. The magnetic resonance system as set forth in claim 12 further including a first combiner/divider means connected between the first and second primary loop circuits and the transmitter means and the receiver means, the first combiner/divider means adding a 90° phase shift in radio frequency signals conveyed from the transmitter means to one of the first and second primary loop circuits relative to signals conveyed to the other of the first and second primary loop circuits for quadrature transmission and for making a 90° phase shift in radio frequency signals travelling from the first and second primary loop circuit to the receiver means for quadrature reception.

14. The resonator system as set forth in claim 13 further including:
a third primary loop circuit inductively coupled to the resonator coil 90° displaced from the second primary loop circuit;
a fourth primary loop circuit inductively coupled to the resonator coil 90° displaced from the third and first primary loop circuits;
a second combiner/divider means connected with the third and fourth primary loop circuits for making a 90° phase shift adjustment in radio frequency signals travelling to and from the third and fourth primary loop circuits;
a second cable means for connecting the second combiner/divider means with the third and fourth primary loop circuits;
the third and fourth primary loop circuits including tank circuits (1) for over-coupling the third and fourth primary loop circuits with the resonator coil such that a resistance greater than a characteristic impedance of the second cable means is presented and (2) for blocking transmission of radio frequency signals of a frequency transmitted and received by the first and second primary loop circuits;
the first and second primary loop circuits including tank circuits which block passage of radio frequency signals of the frequency of radio frequency signals transmitted and received by the third and fourth primary loop circuit.

15. The magnetic resonance system as set forth in claim 12 further including:
a third primary loop circuit inductively coupled with the resonator coil 180° opposite the first primary loop circuit, the third primary loop circuit being connected with an adjustable reactance for tuning the first resonance frequency of the resonator coil; and
a fourth primary coupling circuit inductively coupled with the resonator coil 180° opposite the second primary loop circuit, the fourth primary loop circuit being connected with an adjustable reactance for tuning the second resonance frequency of the resonator coil.

16. A magnetic resonance method comprising:
generating a magnetic field through an examination region within a radio frequency resonator coil, the radio frequency resonator coil being tuned to a natural resonant frequency;

inductively over-coupling at least a first primary loop circuit with the radio frequency resonator coil such that maximum current radio frequency signals are transferred between the resonator coil and the first primary loop circuit at a frequency higher than the natural resonance frequency and at a frequency lower than the natural resonance frequency;

receiving resonance signals from the examination region;

reconstructing the received resonance signals into an image representation.

17. The method as set forth in claim 16 further including inductively over-coupling a second primary loop circuit with the resonator coil 90° offset from the first resonator coil such that radio frequency signals transferred between the resonator coil and the first and second loop circuits are in quadrature.

18. The method as set forth in claim 17 further including:

inductively coupling adjustable reactances to the resonator coil 180° offset from the first and second primary loop circuits;

adjusting the adjustable reactances to tune the frequency of maximum current transfer between the resonator coil and the first and second primary loop circuits independently.

19. The method as set forth in claim 16 further including:

inductively over-coupling third and fourth primary loop circuits to the resonator coil 90° offset from each other and 90° offset from the first and second primary loop circuits;

transferring radio frequency signals in quadrature at a higher frequency between the first and second primary loop circuits and the resonator coil;

transferring radio frequency signals at a lower frequency in quadrature between the third and fourth primary loop circuits and the resonator coil.

20. A magnetic resonance imaging method comprising:

generating a static magnetic field through an examination region within a radio frequency resonator coil;

inductively coupling at least four primary loop circuits at 90° intervals around the resonator coil;

creating magnetic field gradients across the examination region and transferring radio frequency signals of at least first and second frequencies from a radio frequency transmitter means through the primary loop circuits to the resonator coil for transmission into the examination region;

receiving radio frequency resonance signals of the first and second frequencies with the resonator coil and transferring the received resonance signals through the primary loop circuits to a radio frequency receiver means which receives and demodulates radio frequency signals of the first and second frequencies;

reconstructing a first image representation from the first frequency resonance signals and a second image representation from the second radio frequency signals.

* * * * *